(12) United States Patent
Kononchuk (10) Patent No.: US 9,396,987 B2
(45) Date of Patent: Jul. 19, 2016

(54) METHOD FOR FABRICATING A SUBSTRATE AND SEMICONDUCTOR STRUCTURE

(71) Applicant: Soitec, Bernin (FR)

(72) Inventor: Oleg Kononchuk, Grenoble (FR)

(73) Assignee: Soitec, Bernin (FR)

(*) Notice: Subject to any disclaimer, the term of this patent is extended or adjusted under 35 U.S.C. 154(b) by 0 days.

(21) Appl. No.: 14/369,594

(22) PCT Filed: Dec. 21, 2012

(86) PCT No.: PCT/IB2012/002793
§ 371 (c)(1),
(2) Date: Jun. 27, 2014

(87) PCT Pub. No.: WO2013/102788
PCT Pub. Date: Jul. 11, 2013

(65) Prior Publication Data
US 2014/0374886 A1    Dec. 25, 2014

(30) Foreign Application Priority Data
Jan. 6, 2012    (FR) ..................... 12 50162

(51) Int. Cl.
*H01L 21/02* (2006.01)
*H01L 21/762* (2006.01)
*H01L 21/18* (2006.01)
*H01L 21/265* (2006.01)
*H01L 21/683* (2006.01)

(52) U.S. Cl.
CPC ........ *H01L 21/76254* (2013.01); *H01L 21/187* (2013.01); *H01L 21/265* (2013.01); *H01L 21/6836* (2013.01)

(58) Field of Classification Search
USPC ............... 257/E21.568, E21.57, E27.112, 257/E21.318, 347, 607
See application file for complete search history.

(56) References Cited

U.S. PATENT DOCUMENTS

| | | | | |
|---|---|---|---|---|
| 6,100,166 | A  * | 8/2000 | Sakaguchi et al. ............ | 438/455 |
| 6,534,382 | B1 * | 3/2003 | Sakaguchi et al. ............ | 438/455 |
| 6,664,169 | B1 * | 12/2003 | Iwasaki et al. ................ | 438/409 |
| 7,193,294 | B2 * | 3/2007 | Yoshimura et al. ........... | 257/607 |
| 8,106,290 | B2 * | 1/2012 | Ito et al. ....................... | 136/255 |
| 2003/0064535 | A1 | 4/2003 | Kub et al. | |

(Continued)

FOREIGN PATENT DOCUMENTS

EP    1968121 A2    9/2008
EP    1338030 B1    6/2011

OTHER PUBLICATIONS

International Search Report for International Application No. PCT/IB2012/002793 dated Apr. 19, 2013, 4 pages.

*Primary Examiner* — Telly Green
(74) *Attorney, Agent, or Firm* — TraskBritt (57) ABSTRACT

The invention relates to a method for fabricating a substrate, comprising the steps of providing a donor substrate with at least one free surface, performing an ion implantation at a predetermined depth of the donor substrate to form an in-depth predetermined splitting area inside the donor substrate, and is characterized in providing a layer of an adhesive, in particular an adhesive paste, over the at least one free surface of the donor substrate. The invention further relates to a semiconductor structure comprising a semiconductor layer, and a layer of a ceramic-based and/or a graphite-based and/or a metal-based adhesive provided on one main side of the semiconductor layer.

18 Claims, 4 Drawing Sheets

(56) References Cited

U.S. PATENT DOCUMENTS

| | | | |
|---|---|---|---|
| 2003/0203547 A1* | 10/2003 | Sakaguchi et al. | 438/151 |
| 2004/0055894 A1* | 3/2004 | Iwasaki et al. | 205/157 |
| 2004/0224482 A1 | 11/2004 | Kub et al. | |
| 2005/0031822 A1* | 2/2005 | Aihara et al. | 428/40.1 |
| 2006/0118868 A1 | 6/2006 | Yoshimura et al. | |
| 2008/0233280 A1* | 9/2008 | Blanchet et al. | 427/150 |
| 2008/0258191 A1* | 10/2008 | Baniecki et al. | 257/295 |
| 2009/0007960 A1* | 1/2009 | Ito et al. | 136/255 |
| 2009/0170287 A1 | 7/2009 | Endo et al. | |
| 2010/0202114 A1* | 8/2010 | Tuominen | H01L 23/5385 361/728 |
| 2012/0003815 A1 | 1/2012 | Lee | |
| 2012/0038031 A1* | 2/2012 | Sachs et al. | 257/622 |
| 2012/0100646 A1* | 4/2012 | Chan et al. | 438/27 |

* cited by examiner

METHOD FOR FABRICATING A SUBSTRATE AND SEMICONDUCTOR STRUCTURE

CROSS-REFERENCE TO RELATED APPLICATIONS

This application is a national phase entry under 35 U.S.C. §371 of International Patent Application PCT/IB2012/002793, filed Dec. 21, 2012, designating the United States of America and published in English as International Patent Publication WO2013/102788 A1 on Jul. 11, 2013, which claims the benefit under Article 8 of the Patent Cooperation Treaty to French Application Serial No. 1250162, filed Jan. 6, 2012, the disclosure of each of which is hereby incorporated herein in its entirety by this reference.

TECHNICAL FIELD

The invention relates to a method for fabricating a substrate, and to a semiconductor structure. The invention also relates to a method for transferring a layer of a donor substrate onto a receiver substrate.

BACKGROUND

Thin layer transfers between semiconductor substrates using state of the art bonding approaches, such as the SMARTCUT® technology or other molecular bonding techniques, require that the semiconductor wafers or substrates to be bonded both have a low surface roughness. For instance, EP 1 338 030 B1 discloses methods for forming a thin layer on a thick support, which can involve a first transfer step using the SMARTCUT® technology of a thin layer. The required surface quality for molecular bonding techniques is obtained by extensive polishing processes in order to prepare the substrates before the bonding steps can be performed.

Therefore, there is a need for improved layer transfer techniques. In particular, there is a need for alternative bonding techniques in the semiconductor industry.

This object is achieved with the inventive method for fabricating a substrate, comprising the steps of providing a donor substrate with at least one free surface, performing an ion implantation at a predetermined depth of the donor substrate to form an in-depth predetermined splitting area inside the donor substrate, and providing a layer of an adhesive, in particular an adhesive paste, over the at least one free surface of the donor substrate.

Surprisingly, this method has been found to yield satisfying results with semiconductor materials, as no polishing is required prior to applying the adhesive layer. Thus, an ion layer can be implanted inside a donor substrate, and the substrate can be attached to or with the adhesive layer. The inventive method can, thus, advantageously, be used for mass-production of cheap semiconductor substrates and/or semiconductor structures. Without being restricted to the following, the substrate can be a semiconductor, for example, a semiconductor wafer, a semiconductor substrate, a recycled semiconductor substrate, or even a semiconductor structure.

BRIEF SUMMARY

Depending on the conditions, if a layer of a natural oxide is formed on the surface of the donor substrate or another kind of oxide layer is provided on the surface of the donor substrate, a substrate-on-insulator structure can be formed using the inventive method. When the substrate is a semiconductor, a semiconductor-on-insulator can thus be fabricated using the inventive method.

In a variant of a preferred embodiment, the inventive method can further comprise the steps of providing a handle substrate with at least one free surface, and attaching the donor substrate to the handle substrate such that the layer of adhesive is provided between the at least one free surface of the donor substrate and the at least one free surface of the handle substrate.

An advantage of the inventive method is that the main surfaces or main sides by which the donor and handle substrates are attached to each other by means of the adhesive layer do not require a polishing step before the attachment step or any other surface preparation step to provide a surface ready for molecular adhesion. Thus, the inventive method is particularly advantageous if used in the context of transferring layers of semiconductor materials. Also, the adhesive material can be chosen to sustain very high temperatures (up to about 1200° C.), which is not the case for typical prior art oxide bonding layers.

Preferably, the adhesive can be a ceramic-based and/or a graphite-based and/or a metal-based material.

Such adhesives are typically cheaper than polishing techniques followed by molecular bonding techniques known in the art but are still compliant with a semiconductor fabrication environment. Some ceramic-based and/or graphite-based and/or metal-based materials can be provided as one or two component systems, and can be mixed with water and/or special binder systems in order to improve the properties of the adhesive. Further improved results can be obtained when using ceramic-based and/or graphite-based and/or metal-based materials in the context of semiconductor technologies.

Further preferred, the adhesive can be based on at least one of aluminum oxide, aluminum nitride, magnesium oxide, silicon dioxide, silicon carbide, zirconium oxide, zirconium silicate, graphite, copper, and silver.

Ceramic-based and/or graphite-based and/or metal-based materials offer a wide range of physical and chemical properties. The selection of such materials can be optimized depending on the required properties with respect to temperatures, thermal conductivity, dielectric and mechanical strength.

Preferably, the adhesive can be provided over the entire at least one free surface of the donor substrate and/or over the entire at least one free surface of the handle substrate. In this way the adhesive with or without the handle substrate will provide sufficient stiffness over the entire substrate area.

In a further variant of a preferred embodiment, the inventive method can further comprise the step of providing a mold such that the adhesive layer is provided with a predetermined geometry, in particular with a geometry matching that of the at least one free surface of the donor substrate and/or the at least one free surface of the handle substrate.

Using a mold is advantageous as the mold will constrain the geometry of the adhesive to a desired predetermined form. A variety of molds can be fabricated, used and/or adapted to specific needs. For instance, silicone-based compounds or silicone rubber molds can be used efficiently with a ceramic-based adhesive as they typically do not stick to the adhesive and can, therefore, easily be removed after the fabrication process.

Preferably, the inventive method can further comprise the step of performing at least one annealing at a temperature lower than a temperature required for a detachment at the level of the in-depth predetermined splitting area.

Depending on the material chosen for the adhesive, at least one annealing step can be required in order to densify the adhesive layer so that it reaches it desired optimized properties with respect to the donor and/or handle substrates. However, in order to prevent an unwanted initialization of the layer detachment step prior to the densification of the adhesive layer, the at least one annealing step is performed at temperatures lower than what is required for a detachment at the level of the in-depth splitting area inside the substrate. Thus, such an annealing will have the advantage of outgassing water and/or organic solvents of the adhesive paste while keeping the donor substrate with its in-depth weakened layer substantially intact. For instance, at least one annealing is required when using one part or two part systems of ceramic-based compounds.

Preferably, the inventive method can further comprise the step of removing the mold after the annealing step.

When a mold is used, the mold can advantageously be kept during the annealing step until the adhesive layer reaches an appropriate density. The mold may, however, be removed before or after detaching a layer of the donor substrate, with the advantage of being reusable in a subsequent process. For instance, silicone rubber molds can be recycled and/or reused advantageously when used with a ceramic-based adhesive as they typically do not stick to such adhesives.

Preferably, the inventive method can further comprise the step of detaching a remainder of the donor substrate at the level of the in-depth predetermined splitting area.

Thus, a layer of the initial donor substrate can be transferred onto the adhesive layer. Depending on the preferred embodiment, a layer of the donor substrate can be transferred to form a semiconductor structure, according to the invention.

Preferably, the inventive method can further comprise the step of reusing the remainder of the donor substrate as a new donor substrate.

Since the inventive method does not require polishing of the surface over which the adhesive layer will be attached, the remainder of the donor substrate could immediately be reused or recycled as a new donor substrate in a new subsequent layer transfer process, thereby reducing the number of process steps.

Advantageously, the adhesive layer can have a thickness of at least 0.1 μm.

In the case of transferring a thin layer of a semiconductor material, not thick enough to ensure its mechanical stability alone, the adhesive layer can provide the necessary thickness to ensure the mechanical stability of the transferred thin layer. When no handle substrate is used, the mechanical stability of a transferred thin layer can be provided with an adhesive layer having a thickness of about 20 μm to 1 mm. However, when the adhesive is used as bonding layer between the donor substrate and the handle substrate, a thickness of about 0.1 μm to 10 μm can be sufficient.

The object is also achieved with the inventive semiconductor structure comprising a semiconductor layer, and a layer of a ceramic-based and/or a graphite-based and/or a metal-based adhesive provided over one main side of the semiconductor layer.

The invention can be optimized for semiconductor applications. Thus, a semiconductor structure, according to the invention, can be produced for a low cost and can be used for a variety of semiconductor applications without limiting the quality of the semiconductor layer of interest. Ceramic-based and/or graphite-based and/or metal-based adhesives have the advantage of being compliant with a semiconductor fabrication environment.

In a variant of a preferred embodiment, the inventive semiconductor structure can further comprise an insulating layer between the semiconductor layer and the adhesive layer. Thus, the invention also provides cheap semiconductor-on-insulator structures for use in several semiconductor applications.

In a further variant of a preferred embodiment, the inventive semiconductor structure can further comprise a substrate attached to the adhesive by an attachment surface such that the adhesive is provided between the main side of the semiconductor layer and the attachment surface of the substrate. A further advantage of the invention is thus the cheap production of semiconductor structures comprising also at least one other substrate and which can be applied to various fields involving semiconductor technologies.

Advantageously, the adhesive of the inventive structure can comprise at least one of an aluminum oxide, an aluminum nitride, a magnesium oxide, a silicon dioxide, a silicon carbide, a zirconium oxide, a zirconium silicate, graphite, copper, and silver. Thus, the inventive semiconductor structure can be specifically adapted to a particular use depending on its properties relative to temperature, thermal conductivity, dielectric and mechanical strength.

Preferably, the adhesive of the inventive semiconductor structure can be provided on the entire surface of the main side of the semiconductor layer and/or on the entire attachment surface of the substrate. Thus, an inventive structure, with or without a substrate, is provided with sufficient stiffness over the entire semiconductor layer area.

Further preferred, the adhesive layer of the inventive semiconductor structure can have a thickness of at least 20 μm and up to 1 mm when no substrate is used.

Alternatively, the adhesive layer of the inventive semiconductor structure can have a thickness of at least 0.1 μm and up to 10 μm when the adhesive layer is provided between the main side of the semiconductor layer and the attachment surface of the substrate.

Thus, the inventive semiconductor structure has an advantage in that the semiconductor layer is provided with sufficient mechanical stability, regardless of its thickness.

BRIEF DESCRIPTION OF THE DRAWINGS

Preferred embodiments of the present invention can be combined in order to obtain further embodiments. The invention will be described in more detail hereafter, based on advantageous embodiments described in combination with the following figures.

In the various embodiments described hereafter and in FIGS. 1A-3B, the same reference numbers have been used for identical elements or elements sharing similar roles.

DETAILED DESCRIPTION

Figure 1A:
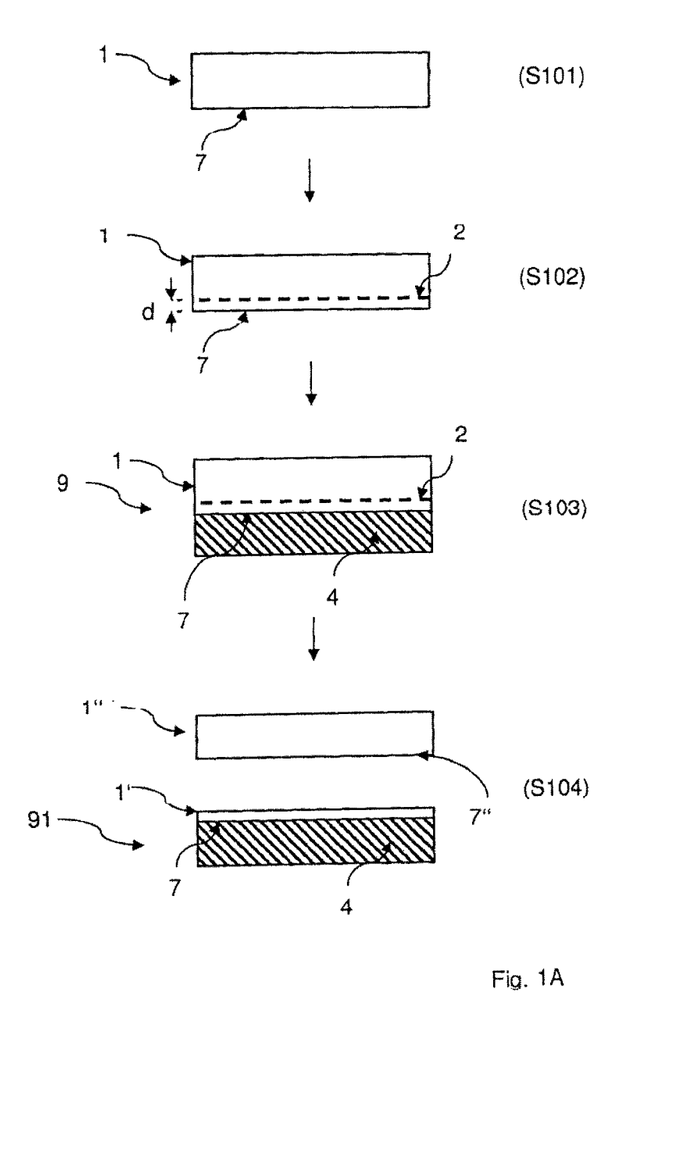
FIG. 1A schematically illustrates a first embodiment of the inventive method.

FIG. 1A schematically illustrates a first embodiment of the inventive method. According to the inventive method, in step S101 of FIG. 1A, a first substrate 1 is provided. In the first embodiment, the substrate 1 is a silicon wafer. However, the inventive method is not restricted to silicon or silicon-based substrates and can be applied to other materials, in particular to any other semiconductor, for instance, SiC or GaN, or to any other semiconductor-based material.

Following the inventive method, step S102 of FIG. 1A illustrates an ion implantation step to form a predetermined splitting area 2 inside the substrate 1, at a predetermined depth d with respect to one of the main surfaces 7 of the substrate 1. The predetermined depth d is typically in a range of about 1 nm up to several hundreds of μm, depending on the application. According to one practical example of the first embodiment of the inventive method, H and/or He ions are implanted into the silicon wafer 1. However, in other embodiments, other ions may be used.

According to the inventive method, step S102 in FIG. 1A is followed by step S103 of providing a layer of an adhesive 4 over the main surface 7 of the substrate 1, thereby forming an intermediate semiconductor structure 9.

According to a preferred variant of the inventive method, the adhesive is a ceramic-based material. In further embodiments of the inventive method, the adhesive could, however, also be a graphite-based and/or a metal-based material comprising one of graphite, copper, and silver. The ceramic-based adhesive paste can be based on aluminum oxide, and/or an aluminum nitride, and/or a magnesium oxide, and/or a silicon dioxide, and/or a silicon carbide, and/or a zirconium oxide, and/or a zirconium silicate, depending on the desired final application, in particular depending on the physical and/or chemical properties of the chosen material for the substrate 1. For instance, CERAMCAST™ materials from Aremco Products, Inc. can be adapted for various embodiments of the inventive method. Such ceramic-based materials can be provided either in one or two component systems. One component systems can be mixed with water or other systems to improve moisture resistance and can be set at room temperature in several hours, and then baked and/or annealed at temperatures of about 90° C. to about 150° C. in a few hours to provide optimal electrical and mechanical properties. Two component systems can be mixed with water and/or other components and have varying set times and can be annealed at similar temperatures but often in shorter times. Depending on the component, some final annealing phases can reach temperatures of about 250° C., but have the advantage of being faster than at lower temperatures.

According to a preferred variant, the adhesive layer 4 is deposited with a thickness of at least 0.1 μm, preferably from 20 μm to 1 mm. Once, the adhesive has hardened, the thickness of the adhesive layer 4 provides for the necessary stiffness required for the mechanical stability of the final structure, as will be described in the subsequent steps of the first embodiment.

Step S103 is followed by one or more annealing steps. In a practical example, the annealing is performed for about 2 hours at a temperature of about 100° C., which, according to the invention, is selected lower than the temperature which is necessary for detaching a layer of the substrate 1 at the level of the in-depth predetermined splitting area 2 of implanted ions. According to a variant of the inventive method, the annealing step can be followed by a second annealing step of about 2 hours at a temperature of about 150° C., also lower than the temperature of layer splitting at the level of the in-depth predetermined splitting area 2. In further variants, depending on the choice of adhesive material, at least one annealing step could be performed at room temperature. The at least one annealing has the advantageous effect of outgassing water and/or organic solvents of the ceramic adhesive layer 4 without, however, substantially weakening the in-depth predetermined splitting area 2 inside the substrate 1.

Figure 1B:
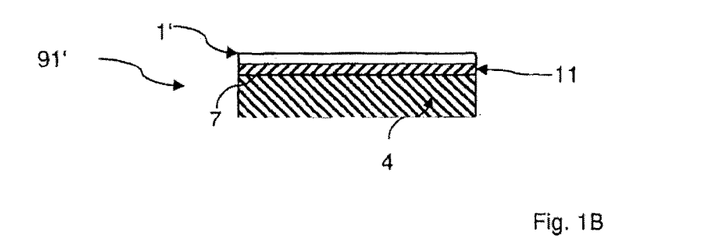
FIG. 1B schematically illustrates a variant of the product of the first embodiment.

In step S104, as illustrated in FIGS. 1A, 1B, a final annealing is performed at a higher temperature in order to detach a layer of the substrate 1 at the level of the predetermined splitting area 2. Typically, the final annealing is performed for about 2 hours at a temperature of about 400° C. The final annealing temperature and its duration can, however, be adapted as a function of the implanted ions and the substrate properties.

As a result of the method, according to the first embodiment, a layer 1' of the substrate 1 remains attached to the adhesive layer 4, forming an inventive semiconductor structure 91. The layer 1' has a thickness of about 1 nm up to several hundreds of μm, corresponding to the depth d of the in-depth predetermined splitting area 2 formed by the implanted ions below the main surface 7 of the initial donor substrate 1. The adhesive layer 4 provides for the stiffness of the semiconductor structure 91, in particular for the mechanical stability of the transferred layer 1'.

In another variant, the remainder 1" of the initial substrate 1 can be reused or recycled as a new donor substrate in a new step S101 of a subsequent layer transfer process, according to the inventive method. As no particular surface quality is needed for the attachment surface 7, there is no obligation to polish the surface 7" of the remainder 1" prior to reuse.

Contrary to layer bonding or layer transfer techniques by molecular bonding, which require bonding surfaces with a very low roughness, and, thus, polishing steps prior to the layer bonding or layer transfer steps, according to the inventive method, the surface quality of a main surface 7 of the substrate 1 does not have to be as good as to enable bonding via molecular forces. Thus, an advantage of the inventive method is that a main surface 7 of the substrate 1 does not require a prior polishing step or any other surface preparation step to provide a surface ready for molecular adhesion. A further advantage is that an adhesive material is simple to provide in the required thickness, in particular in order to obtain a desired mechanical stability of the intermediate structure and/or the inventive final structure.

Depending on the desired final structure, a layer 11 of a natural oxide or a deposited dielectric, such as $SiO_2$ or the like, may be present on or over at least the main surface 7 of the substrate 1 prior to the step of providing the layer of adhesive 4. Thus, depending on the chosen material for the adhesive layer 4 and the substrate 1 and the experimental conditions, the product of the inventive method can be a semiconductor-on-insulator (SOI) type structure. For instance, in the variant of the final product of the first embodiment as illustrated in FIG. 1B, a silicon-on-insulator structure 91' is obtained, wherein a layer of a natural oxide 11 forms an insulating layer between the semiconductor layer 1' and the adhesive layer 4.

Figure 2:
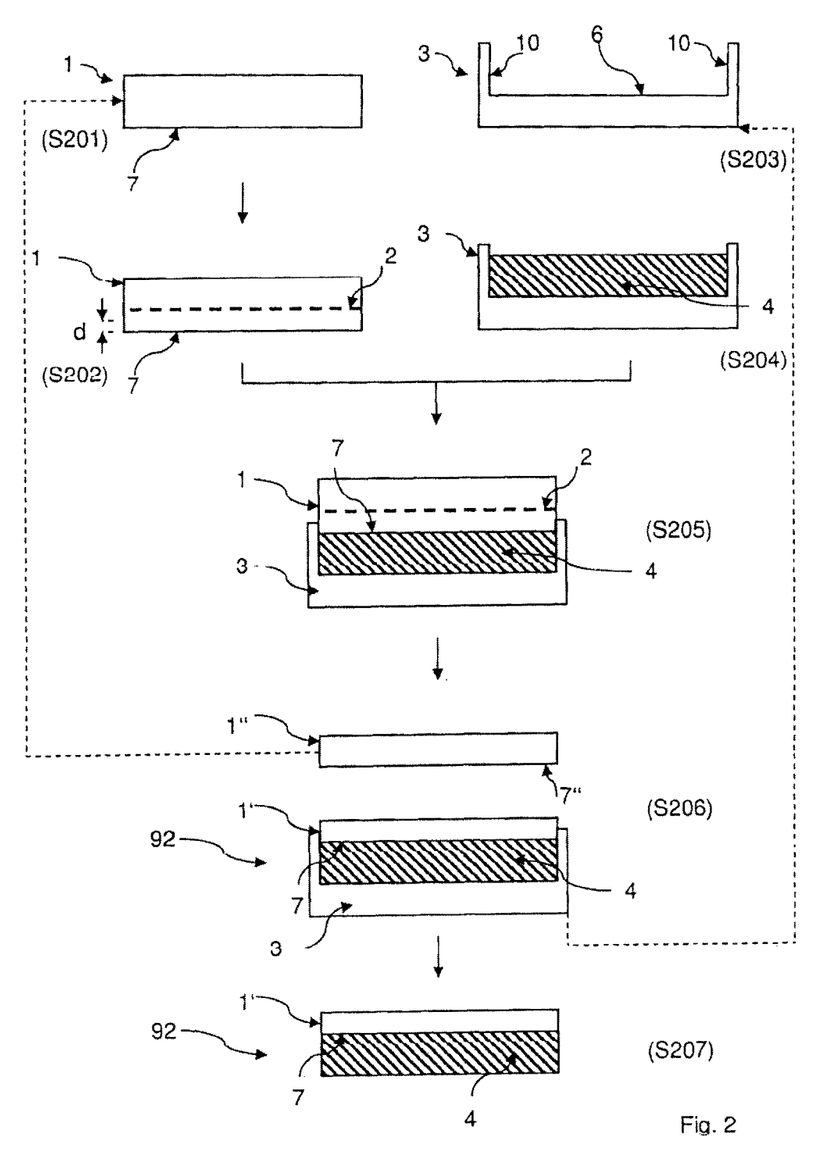
FIG. 2 schematically illustrates a second embodiment of the inventive method.

A second embodiment of the invention is illustrated in FIG. 2. Steps S201 and S202 of the second embodiment represented in FIG. 2 correspond to steps S101 and S102 of the first and second embodiments. It is, therefore, referred back to the description above. Like in the first and second embodiments, the materials used for the donor substrate 1 and the implanted ions used for the in-depth predetermined splitting area 2 are only used for illustrative purposes, and other materials and/or ions can be used in further embodiments.

According to an advantageous variant of the inventive method, the second embodiment further comprises step S203 illustrated in FIG. 2 of providing a mold 3. When using ceramic adhesive materials, like, for instance, in the first embodiment, silicone molding compounds, like, e.g., EZ- CAST™ silicone rubber molds, can be adapted to various embodiments of the present invention.

Such a mold 3 made out of a silicone rubber compound has the advantage that the deposited adhesive layer 4 that will be used later in the process does not stick to it. The mold 3 is cast from a master form such that it comprises a pattern 6 with a geometry matching the geometry of the substrate 1. In the second embodiment, since the substrate 1 is a silicon wafer, the pattern 6 of the mold 3 thus matches the geometry of such a wafer, in particular, the geometry of the main bottom surface of the pattern 6 in the mold 3 matches the geometry of the at least one free surface 7 of the substrate 1, and the depth of the side walls 10 of the pattern 6 can be adjusted to a desired value depending on the desired thickness of the adhesive layer 4.

As illustrated by step S204 in FIG. 2, in the second embodiment, an adhesive such as the adhesive used for the first embodiment is applied on the entire main surface of the pattern 6 of the mold 3, and fills at least partially a predetermined thickness of the pattern 6. Thus, an adhesive layer 4 is formed with a geometry based on the geometry of the pattern 6, in particular with a geometry matching the main surface 7 of the silicon wafer or substrate 1. In the second embodiment, the adhesive layer 4 has a thickness of at least 0.1 µm, preferably from 20 µm to 1 mm, which is inferior or equal to the depth of the side walls 10 of the pattern 6 inside the mold 3.

As can be seen on FIG. 2, step S204 of the second embodiment is followed by step S205 of placing the substrate 1 with the in-depth predetermined splitting area 2 of implanted ions on or in the pattern 6 of the mold 3 such that the entire surface 7 of the substrate 1 is in contact with the entire surface of the adhesive layer 4 present inside the pattern 6.

In the second embodiment, and as illustrated in step S205, the adhesive layer 4 covers the main surface of the pattern 6, but does not necessarily fill up to the thickness of the side walls 10 of the pattern 6. A part of the side walls 10 of the pattern 6 can thus partially overlap with the side walls of the substrate 1 so that an alignment between the shape of the substrate 1 and the adhesive 4 is achieved.

According to an advantageous variant of the inventive method, the second embodiment further comprises a step S206 after step S205, as illustrated in FIG. 2. Step S206 comprises a first annealing phase followed by a final annealing or detachment step, which is similar to step S104 of the second embodiment, and presents similar functions and advantages. It is, therefore, referred back to the description above.

Step S207 of the second embodiment consists in removing the mold 3 such that the inventive structure 92 is obtained. The mold 3 can either be discarded or recycled or reused in step S203. Thus, in the second embodiment, a layer 1' of the initial semiconductor substrate 1 is transferred onto the ceramic-based adhesive layer 4, and a remainder 1" of the initial substrate 1 is detached during the detachment step in order to obtain final semiconductor structure 92.

In further embodiments, the remainder 1" of the initial donor substrate 1 can be recycled, without necessarily going through a polishing step, as a new donor substrate in step S201. In further embodiments, an insulating layer may have formed naturally or have been deposited at least on the surface 7 of the substrate 1, such that a semiconductor-on-insulator layer is transferred onto the adhesive layer 4, similar to what is illustrated in FIG. 1B for the first embodiment.

In the second embodiment, using a mold 3 has the advantage that the geometry of the deposited adhesive layer 4 is constrained and provides the final structure 92 with sufficient stiffness and mechanical stability over the entire surface 7 of the transferred layer 1'. Furthermore, the mold 3 of the second embodiment has the advantage that the adhesive layer 4 does not stick to it so that the step of removing the mold 3 does not risk damaging the final structure 92. A further advantage is that such a mold 3 can be reused or recycled, which can save further productions costs.

Figure 3A:
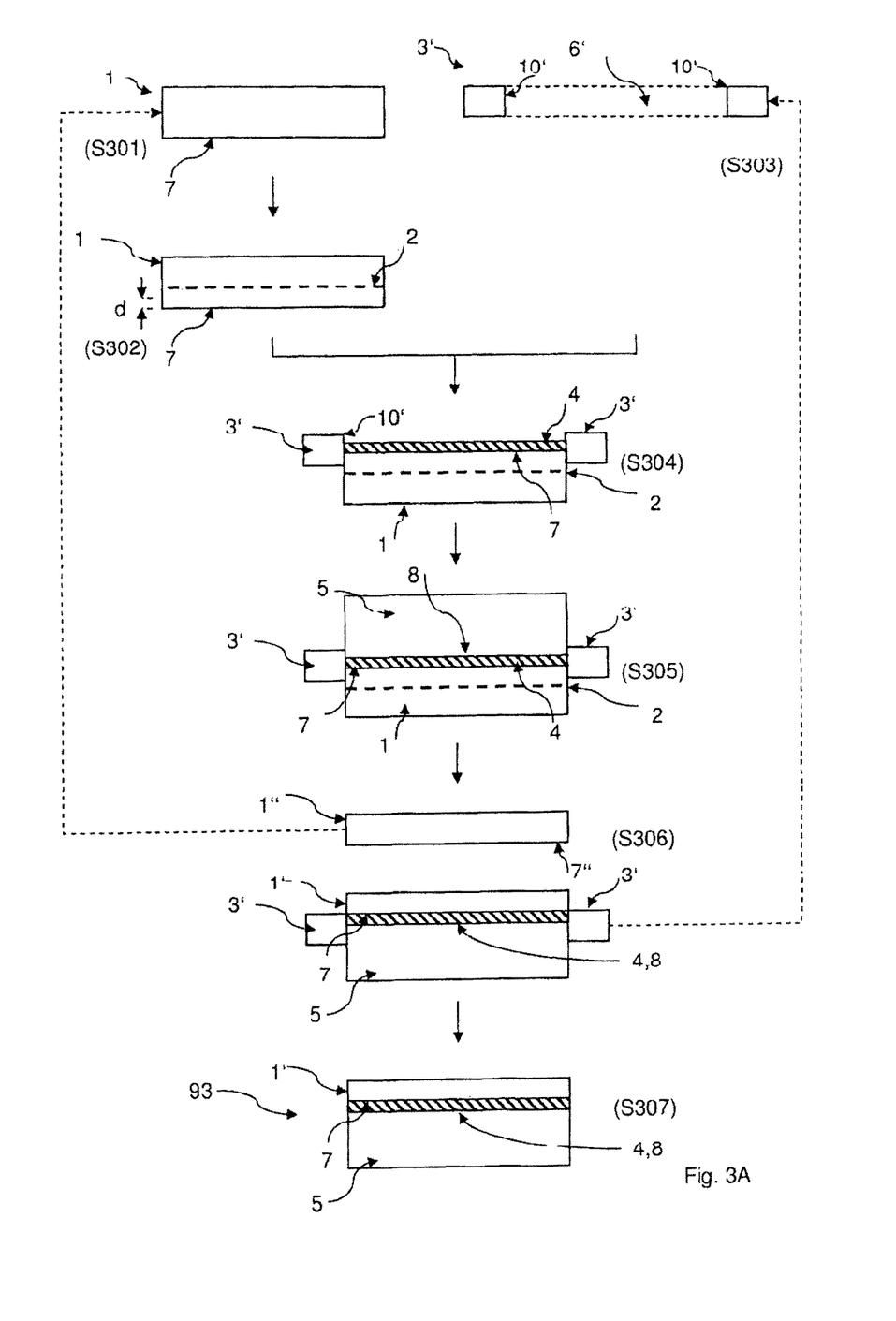
FIG. 3A schematically illustrates a third embodiment of the inventive method.

FIG. 3A illustrates the inventive method in a third embodiment, comprising steps S301 and S302 of providing a donor substrate 1 and implanting ions inside the substrate 1 such as to form an in-depth predetermined splitting area 2. Steps S301 and S302 of the third embodiment are similar to steps S101 and S102 of the first embodiment and to steps S201 and S202 of the second embodiment. It is, therefore, referred back to the description above. Like in the previous embodiments, the materials used for the donor substrate 1 and the implanted ions used for the in-depth predetermined splitting area 2 are only used for illustrative purposes, and other materials and/or ions can be used in further embodiments.

As illustrated in FIG. 3A, the third embodiment further comprises step S303 of providing a second type of mold 3'. This step is similar to step S203 of the second embodiment. It is, therefore, referred back to the description above. However, the pattern 6' of the mold 3' in the third embodiment is different from the pattern 6 of the mold 3 in the second embodiment, as in the third embodiment the pattern 6' extends through the entire thickness of the mold 3', forming a hole with side walls 10' in the mold 3', the main section of pattern 6' matching the surface 7 of the donor substrate 1, for instance, the silicon wafer of the first embodiment.

The third embodiment further comprises step S304. In this step, the donor substrate 1 is placed at least partially in the pattern 6' of the mold 3', overlapping with the side walls 10' and leaving at least a predetermined thickness of the pattern 6' for applying an adhesive layer 4. The properties of the adhesive layer 4 are similar to those described in the previous embodiments. It is, therefore, referred back to the description above for details. In the third embodiment, the adhesive layer 4 covers the entire surface 7 of the substrate 1 and has a thickness of at least 0.1 µm, preferably from 0.1 µm to 10 µm, which does not fill the remaining portion of the pattern 6'. In other embodiments of the inventive method, the thickness of the adhesive layer 4 can be more important, it can even be at least equal to the depth of the side walls 10'. In further embodiments, the mold 3' can be placed over the substrate 1 such that no side wall 10' of the pattern 6' overlaps with the substrate 1. All these embodiments can be combined to produce even further embodiments.

Then, step S305 consists in providing a second substrate 5. As illustrated in step S305 of FIG. 3A, the second substrate 5 is attached by one of its free surfaces, in particular an attachment surface 8, to the adhesive layer 4. In the third embodiment, the geometry of the second substrate 5 is such that its attachment surface 8 matches the geometry of the main surface 7 of the first substrate 1, and the thickness of the ceramic-based adhesive layer 4 is such that the second substrate 5 also overlaps partially with the side walls 10' inside the pattern 6'. Depending on the embodiment, other situations may require that the geometry of the attachment surface 8 of the second substrate 5 is different than that of the main surface 7 of the first substrate 1, and/or that the substrate 5 is placed on the mold 3', in particular over the pattern 6', but does not overlap with the side walls 10' of the pattern 6'. In the third embodiment, the second substrate 5 can be another semiconductor wafer, for example, comprising silicon and/or quartz and/or any other semiconductor, or a plastic-based material or the like, or a ceramic-based material like aluminum nitride or the like, or a metal like molybdenum or the like.

As a variant, the second substrate 5 could be first placed in the mold 3' at step S304 such that the adhesive 4 would be applied to the attachment surface 8 of the second substrate 5 before attaching substrate 1 by its main surface 7 to the adhesive layer 4 in step S305.

In step S306, according to further preferred variants of the inventive method, the third embodiment further comprises performing annealing and detachment steps, which are similar to step S104 of the first embodiment and step S206 of the second embodiment, and present similar functions and advantages. It is, therefore, referred back to the description above.

After the detachment step in S306, the remainder 1" of the initial donor substrate 1, for instance, the silicon wafer of the first embodiment, is removed and can be reused in step S301 or recycled. Like mentioned above, for the reuse no additional polishing step is necessary.

After step S306, like step S207 of the second embodiment, step S307 of the third embodiment, as illustrated in FIG. 3A, also comprises a step of removing the mold 3', which can then be recycled, for instance, in Step S303 or discarded. In step S307 of the third embodiment, as illustrated in FIG. 3A, a final semiconductor structure 93, according to the invention, is obtained. The semiconductor structure 93 comprises a thin silicon layer 1' attached to a handle substrate 5 via the ceramic-based adhesive layer 4. In the third embodiment, according to one aspect of the invention, the geometry of the adhesive layer 4 matches the geometry of the thin layer 1' and/or that of the handle substrate 5. In particular, the adhesive layer 4 is deposited over the entire respective attachment surfaces 7, 8 of the thin layer 1' and the second substrate 5.

Figure 3B:
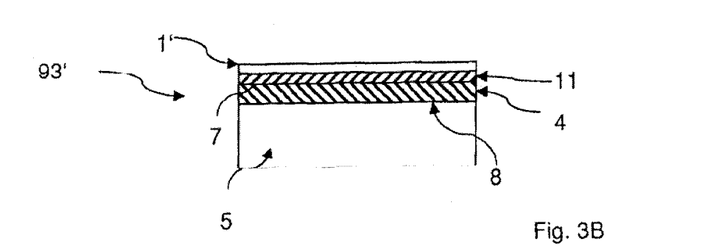
FIG. 3B schematically illustrates a variant of the product of the third embodiment.

Similar to the first embodiment, depending on the experimental conditions and the user requirements, a natural oxide may have formed or a further insulating layer 11 may have been provided over the surface 7 of the initial donor substrate 1 such that a final structure 93', as illustrated in FIG. 3B, is obtained. The product of the inventive method, according to the third embodiment and its variants, can thus be a semiconductor-on-insulator (SOI) structure comprising an insulating layer 11 provided between a thin layer 1' of a semiconductor substrate 1 and a ceramic-based adhesive layer 4 to which a second substrate 5 is attached by an attachment surface 8.

In a preferred variant of an embodiment of the invention, the adhesive, in particular the ceramic-based compound used for the adhesive layer 4, can be chosen depending on its constant of thermal expansion (CTE). For instance, if a further application of the final substrate or the semiconductor structure (91, 91', 92, 93, 93'), according to the invention, requires epitaxial deposition on the thin layer 1', a requirement for selecting the proper adhesive, in particular the proper ceramic-based adhesive, can be that its CTE should be compatible with the CTE of the epitaxial material.

Thus, the inventive method provides with an alternative technique for attaching a layer of a donor substrate 1, for example, to a handle substrate 5. An advantage of the inventive method is that the attachment surfaces 7, 8 of the substrates 1, 5 to be attached do not require polishing steps prior to the attachment step. Preferred variants of the inventive method use ceramic-based adhesives that can advantageously be selected in order to be compliant with the thermal and/or mechanical and/or conductive properties of the substrate 1, and that offer the necessary stiffness for the mechanical stability of the transferred layer 1' of the donor substrate 1. Further preferred variants of the inventive method have the advantage of using a mold 3, 3' which, depending on the chosen material, can be reused, in particular recycled for further embodiments of the inventive method. Further advantageous embodiments of the invention allow recycling a remainder 1" of the donor substrate 1. The invention further provides a diversity of inventive structures, for instance, semiconductor-on-insulator structures, which have advantageous applications in various technological environments.

The embodiments described above and further variants of the same embodiments can be combined in order to realize even further embodiments of the invention.

The invention claimed is:

1. A method for fabricating a substrate, comprising the steps of:
   providing a donor substrate with at least one free surface and at least one sidewall; performing an ion implantation at a predetermined depth within the donor substrate to form a predetermined splitting area inside the donor substrate at the predetermined depth;
   positioning the donor substrate at least partially within a recess or hole in a mold, the mold including at least one sidewall within the recess or hole having a geometry matching a geometry of the at least one sidewall of the donor substrate; and
   providing a layer of an adhesive paste over an entirety of the at least one free surface of the donor substrate while the at least one sidewall of the mold within the recess or hole at least partially overlaps the at least one sidewall of the donor substrate, the at least one sidewall of the mold confining the layer of the adhesive paste to a region adjacent the at least one free surface of the donor substrate.

2. The method of claim 1, further comprising the steps of providing a handle substrate with at least one free surface, and attaching the donor substrate to the handle substrate such that the layer of adhesive paste is provided between the at least one free surface of the donor substrate and the at least one free surface of the handle substrate.

3. The method of claim 1, wherein the adhesive paste is at least one of a ceramic-based, a graphite-based, and a metal-based material.

4. The method of claim 3, wherein the adhesive paste is based on at least one of aluminum oxide, aluminum nitride, magnesium oxide, silicon dioxide, silicon carbide, zirconium oxide, zirconium silicate, graphite, copper, and silver.

5. The method of claim 2, wherein the layer of adhesive paste is applied to at least one of the entire at least one free surface of the donor substrate and the entire at least one free surface of the handle substrate prior to attaching the donor substrate to the handle substrate such that the layer of adhesive paste is provided between the at least one free surface of the donor substrate and the at least one free surface of the handle substrate.

6. The method of claim 1, further comprising annealing the layer of adhesive paste at an annealing temperature lower than a temperature required for a detachment at the level of the predetermined splitting area.

7. The method of claim 1, further comprising the step of detaching a remainder of the donor substrate at the level of the predetermined splitting area.

8. The method of claim 7, further comprising the step of reusing the remainder of the donor substrate as a new donor substrate.

9. The method of claim 1, wherein the layer of adhesive paste has a thickness of at least 0.1 µm.

10. A semiconductor-on-insulator (SOI) substrate, comprising:
    a semiconductor layer; and
    a layer of hardened adhesive paste provided over an entire surface of one main side of the semiconductor layer, the layer of hardened adhesive paste having a thickness in a range extending from 20 µm to 1 mm so as to provide stiffness required for the mechanical stability of the SOI substrate, the hardened adhesive paste at least one of a ceramic-based adhesive, a graphite-based adhesive, and a metal-based adhesive.

11. The SOI substrate of claim 10, further comprising an insulating layer between the semiconductor layer and the layer of hardened adhesive paste.

12. The SOI substrate of claim 10, further comprising a substrate having an attachment surface in physical contact with the hardened adhesive paste such that the hardened adhesive paste is provided between the main side of the semiconductor layer and the attachment surface of the substrate.

13. The SOI substrate of claim 10, wherein the hardened adhesive paste comprises at least one of an aluminum oxide, an aluminum nitride, a magnesium oxide, a silicon dioxide, a silicon carbide, a zirconium oxide, a zirconium silicate, graphite, copper, and silver.

14. The SOI substrate of claim 12, wherein the hardened adhesive paste provided on at least one of the entire surface of the main side of the semiconductor layer and the entire attachment surface of the substrate.

15. The method of claim 2, wherein the adhesive paste is at least one of a ceramic-based, a graphite-based, and a metal-based material.

16. The method of claim 1, wherein positioning the donor substrate at least partially within the recess or hole in the mold comprises positioning the donor substrate at least partially within a recess or hole in a silicone rubber mold.

17. The method of claim 16, wherein positioning the donor substrate at least partially within a recess or hole in the silicone rubber mold comprises positioning the donor substrate at least partially within a recess in the silicone rubber mold.

18. The method of claim 9, wherein the layer of adhesive paste has a thickness in a range extending from 20 µm to 1 mm.

* * * * *